US012359317B2

(12) United States Patent
Park et al.

(10) Patent No.: US 12,359,317 B2
(45) Date of Patent: Jul. 15, 2025

(54) RARE EARTH PRECURSOR, METHOD OF PREPARING THE SAME, AND METHOD OF FORMING THIN FILM USING THE SAME

(71) Applicant: HANSOL CHEMICAL CO., LTD., Seoul (KR)

(72) Inventors: Mi-Ra Park, Jeollabuk-do (KR); Kyu-Hyun Yeom, Jeollabuk-do (KR); Hyun-Kyung Lee, Jeollabuk-do (KR); Jang-Hyun Seok, Sejong-si (KR); Jung-Woo Park, Seoul (KR)

(73) Assignee: HANSOL CHEMICAL CO., LTD., Seoul (KR)

( * ) Notice: Subject to any disclaimer, the term of this patent is extended or adjusted under 35 U.S.C. 154(b) by 758 days.

(21) Appl. No.: 17/524,048

(22) Filed: Nov. 11, 2021

(65) Prior Publication Data

US 2022/0145461 A1 May 12, 2022

(51) Int. Cl.
*C23C 16/455* (2006.01)
*C07F 19/00* (2006.01)

(52) U.S. Cl.
CPC ........ *C23C 16/45553* (2013.01); *C07F 19/00* (2013.01)

(58) Field of Classification Search
CPC . C23C 16/45553; C23C 16/40; C23C 16/405; C07F 19/00; C07F 7/10; C07F 5/00
See application file for complete search history.

(56) References Cited

FOREIGN PATENT DOCUMENTS

| EP | 2460807 A1 * | 6/2012 | ............. C07F 17/00 |
| KR | 10-2012-0059440 A | 6/2012 | |
| KR | 10-2138707 B | 7/2020 | |
| TW | 202030195 A | 8/2020 | |

OTHER PUBLICATIONS

Polly L. Arnold and Ian J. Casely, "F-Block N-Heterocyclic Carbene Complexes", Chemical Reviews, 2009, vol. 109, No. 8, p. 3599-3611, Publication Date: Apr. 9, 2009.
Herrmann, et al., 1,3-Dimethylimidazolin-2-ylidene Carbene Donor Ligation in Lanthanide Silylamide Complexes, Organometallics, 1997, 16, 4, 682-688, Germany.

* cited by examiner

*Primary Examiner* — Michael G Miller
(74) *Attorney, Agent, or Firm* — Brooks, Cameron & Huebsch, PLLC

(57) ABSTRACT

The present disclosure relates to a compound capable of implementing thin film deposition through vapor deposition, and more particularly, to a rare earth compound which is applicable to atomic layer deposition (ALD) or chemical vapor deposition (CVD) and has excellent thermal stability and reactivity, a rare earth precursor containing the same, a method of preparing the same, and a method of forming a thin film using the same.

6 Claims, 3 Drawing Sheets

RARE EARTH PRECURSOR, METHOD OF PREPARING THE SAME, AND METHOD OF FORMING THIN FILM USING THE SAME

CROSS-REFERENCE TO RELATED APPLICATION(S)

This application claims priority to Korean Patent Application No. 10-2020-0149843, filed on Nov. 11, 2020, the disclosure of which is incorporated herein by reference in its entirety.

BACKGROUND

Technical Field

The present disclosure relates to a vapor deposition compound capable of implementing thin film deposition through vapor deposition, and more particularly, to a rare earth precursor which is applicable to atomic layer deposition (ALD) or chemical vapor deposition (CVD) and has excellent volatility and thermal stability and excellent reactivity with a reactive gas, a method of preparing the same, and a method of forming a thin film using the same.

Description of the Related Art

A transistor using silicon oxide ($SiO_2$) as a dielectric, which has been used for decades, has been recently replaced by a "high-k metal gate transistor" in accordance with close packing of a semiconductor device and a reduction in channel length.

In particular, a novel gate dielectric material for a memory device and a capacitor of a dynamic random access memory (DRAM) has been required.

As a size of a device is reduced up to a level of 20 nm, the demand for high-k materials and processes has increased.

Preferably, a high-k material is required to have a high band gap and band off-set, a high-k value, excellent stability against a silicon phase, a minimal $SiO_2$ interfacial layer, and a high quality interface on a substrate. In addition, an amorphous or highly crystalline temperature film is preferred.

Hafnium oxide ($HfO_2$) or the like is a representative high-k material being actively studied and applied to replace silicon oxide. In particular, a next-generation high-k material has been continuously required in a process for a device having a size of 10 nm or less.

Rare earth-doped hafnium oxide or the like has been discussed as a potential candidate for the next-generation high-k material.

In particular, a material containing a rare earth element is a promising high-k dielectric material for an advanced silicon CMOS, germanium CMOS, or III-V transistor, and a new-generation oxide based on these materials is reported to provide significant advantages in capacity as compared to a general dielectric material.

In addition, the material containing a rare earth element is expected to be applied for preparing a perovskite material having properties such as ferroelectricity, pyroelectricity, piezoelectricity, and a resistance change. That is, the material containing a rare earth element has been studied to prepare $ABO_3$ type perovskite through a vapor deposition process using an organometallic compound precursor, control the type or composition of A and B cations (rare earth or transition metal), and impart various properties such as dielectricity, electron conductivity, and oxygen ion conductivity, thereby using the material containing a rare earth element in various industrial fields such as a fuel cell, a sensor, and a secondary battery.

In addition, the material containing a rare earth element has been actively studied to be used for implementing an encapsulating material utilizing excellent moisture penetration resistance of a multilayer oxide thin film structure or a next-generation non-volatile memory.

However, the deposition of layers containing rare earth elements is still difficult. Thus, the development of novel materials and processes has been constantly required. Therefore, a rare earth precursor having various ligands has been studied.

Typical examples of the ligand constituting the rare earth precursor include compound groups such as amide, amidinate, β-diketonate, and cyclopentadienyl (Cp). However, these precursors have a high melting point, a low deposition temperature, a large amount of impurities in a thin film, and a relatively low reactivity, and thus are difficult to apply to a practical process.

Specifically, lanthanide 2,2,6,6-tetramethylheptanedionate ($[La(tmhd)_3]$) has a high melting point of 260° C. or higher, and lanthanide 2,2,7-trimethyloctanedionate ($[La(tmod)_3]$) has a melting point of 197° C. In addition, in the case of β-diketonate, it is significantly difficult to control the delivery efficiency thereof, a growth rate of a thin film is low, and the purity of the thin film is low due to a high carbon impurity production rate.

The cyclopentadienyl (Cp) compound may implement some liquid compounds, but has a high content of carbon impurities in a thin film in a process evaluation.

It is proved that molecule design may help improve volatility and reduce a melting point, but is limited in use under process conditions. For example, $La(iPrCp)_3$ (iPr is isopropyl) is not suitable for an ALD process at a temperature higher than 225° C.

$RE(NR_2)_3$ (RE is a rare earth element), which is an amide-based ligand, is not suitable for an ALD or CVD process due to structural instability of a compound.

In addition, some of rare earth-containing precursors currently available have many problems when used in a deposition process. For example, a fluorinated rare earth precursor can produce $REF_3$ (RE is a rare earth element) as a by-product. This by-product is known to be difficult to remove.

That is, the rare earth precursors according to the related art are not thermally stable at a high temperature, and thus have a low deposition rate during a chemical vapor deposition (CVD) or atomic layer deposition (ALD) process.

As a result, there is a need to develop an alternative precursor for deposition of a rare earth-containing film.

Related Art Document

Patent Document (Patent Document 1) Korean Patent No. 10-2138707

SUMMARY

The present disclosure is intended to solve the problems of the existing rare earth precursor as described above, and an object of the present disclosure is to provide a rare earth precursor compound for deposition having excellent thermal stability and volatility and excellent reactivity with a reactive gas.

Another object of the present disclosure is to provide a method of manufacturing a thin film using the rare earth precursor compound.

However, the problems to be solved by the present disclosure are not limited to the objects described above, and other problems not described will be clearly understood by those skilled in the art from the following description.

Studies on various ligands have been conducted to solve the problems of the rare earth precursor as described above, but homoleptic rare earth precursors in which all the types of ligands are the same as each other still have the same problems. In addition, the newly emerging heteroleptic compounds since that time have advantages such as excellent thermal stability and volatility but have disadvantages such as low reactivity with a reactive gas.

Therefore, in order to solve these problems, the present inventors synthesized a heteroleptic rare earth precursor capable of supplementing the disadvantage such as low reactivity with a reactive gas while maintaining the existing advantages of the heteroleptic compound.

In particular, the present inventors synthesized a rare earth precursor containing one ligand selected from the group consisting of alkoxide, amide, and alkyl, and a neutral ligand.

As a result, it is possible to obtain a rare earth precursor having excellent volatility and thermal stability and high reactivity with a reactive gas, compared to the rare earth precursor compound known in the related art.

A compound according to one embodiment of the present disclosure is represented by the following Formula 1,

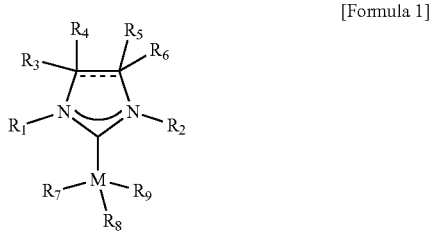

[Formula 1]

in Formula 1,

M is a rare earth element, $R_1$ to $R_6$ are each independently hydrogen or a linear or branched alkyl group having 1 to 6 carbon atoms, $R_7$ to $R_9$ are each independently a linear or branched alkyl group having 1 to 5 carbon atoms, $-OR_{10}$, or $-N(R_{11})_2$.

$R_{10}$'s are each independently hydrogen or a linear or branched alkyl group having 1 to 6 carbon atoms, $R_{11}$'s are each independently hydrogen, a linear or branched alkyl group having 1 to 6 carbon atoms, or $Si(R_{12})_3$, and Rues are each independently hydrogen or a linear or branched alkyl group having 1 to 6 carbon atoms.

A vapor deposition precursor according to another embodiment of the present disclosure contains the compound.

A method of manufacturing a thin film according to still another embodiment of the present disclosure includes introducing the vapor deposition precursor into a chamber.

Advantageous Effects

The novel vapor deposition rare earth compound according to the present disclosure and the precursor containing the vapor deposition rare earth compound have excellent thermal stability and volatility and excellent reactivity with a reactive gas.

The uniform thin film deposition may be implemented using the vapor deposition precursor according to the present disclosure, and thus, excellent thin film physical properties, thickness, and step coverage may be secured.

The physical properties as described above may implement a precursor suitable for atomic layer deposition and chemical vapor deposition and may contribute to excellent thin film properties.

DESCRIPTION OF SPECIFIC EMBODIMENTS

Figure 1:
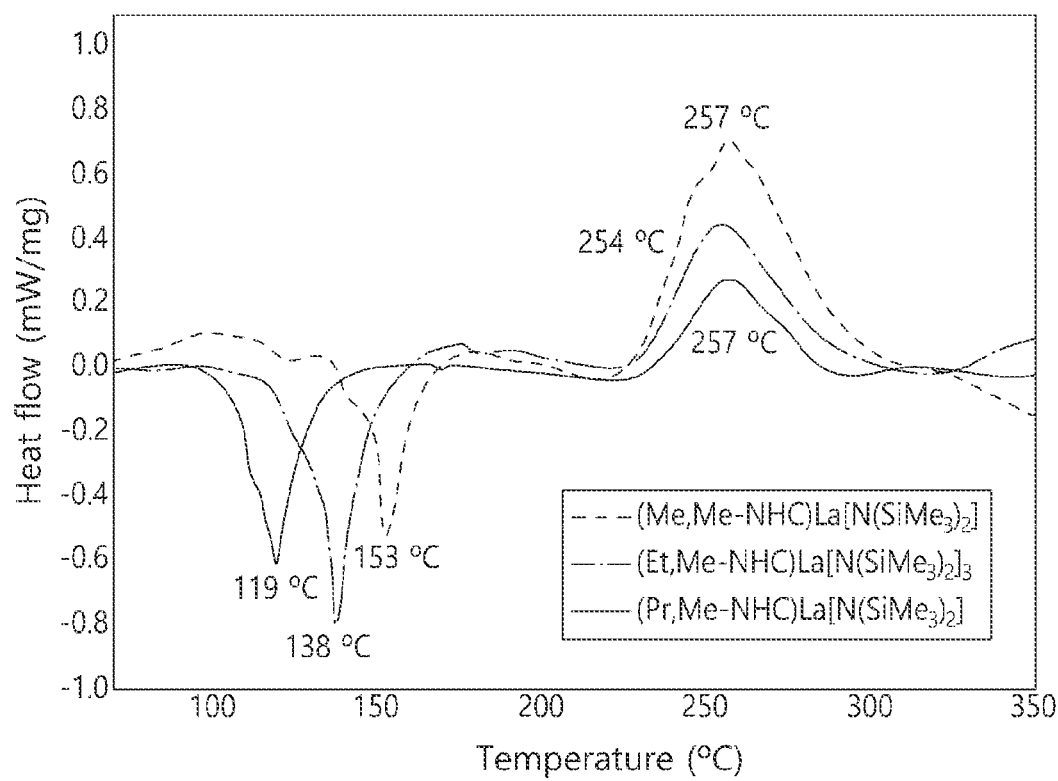
FIG. 1 is a graph showing results of differential scanning calorimetry (DSC) analysis of compounds of Example 1 ((Me,Me-NHC)La[N(SiMe$_3$)$_2$]$_3$), Example 2 ((Et,Me-NHC)La[N(SiMe$_3$)$_2$]$_3$), and Example 4 (($^i$Pr,Me-NHC)La[N(SiMe$_3$)$_2$]$_3$) of the present disclosure.

Hereinafter, embodiments and examples of the present disclosure will be described in detail so that the present disclosure may be easily implemented by those skilled in the art to which the present disclosure pertains. However, the present disclosure may be implemented in various different forms and is not limited to embodiments and examples described herein.

Hereinafter, embodiments and examples of the present disclosure will be described in detail. However, the present disclosure is not limited to these embodiments and examples and drawings.

A compound according to one embodiment of the present disclosure is represented by the following Formula 1,

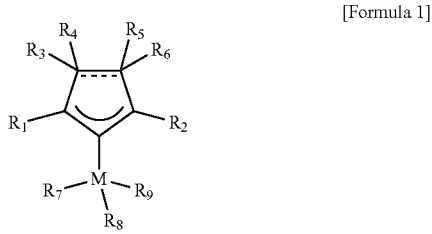

[Formula 1]

in Formula 1,

M is a rare earth element, $R_1$ to $R_6$ are each independently hydrogen or a linear or branched alkyl group having 1 to 6 carbon atoms, $R_7$ to $R_9$ are each independently a linear or branched alkyl group having 1 to 5 carbon atoms, $-OR_{10}$, or $-N(R_{11})_2$, $R_{10}$'s are each independently hydrogen or a linear or branched alkyl group having 1 to 6 carbon atoms, $R_{11}$'s are each independently hydrogen, a linear or branched alkyl group having 1 to 6 carbon atoms, or $Si(R_{12})_3$, and $R_{12}$'s are each independently hydrogen or a linear or branched alkyl group having 1 to 6 carbon atoms.

That is, the compound of the present disclosure is a heteroleptic compound in which all types of ligands are not same as each other and two or more types of ligands are contained, and contains N-heterocyclic carbene as a neutral ligand.

In addition, the compound of the present disclosure contains one ligand selected from the group consisting of alkoxide, amide, and alkyl.

The N-heterocyclic carbene improves thermal stability of the compound, and one ligand selected from the group consisting of alkoxide, amide, and alkyl improves volatility of the compound and increases reactivity with a reactive gas.

In one embodiment of the present disclosure, preferably, $R_1$ to $R_6$ and $R_{10}$ to $R_{12}$ may be each independently one selected from the group consisting of hydrogen, a methyl group, an ethyl group, an n-propyl group, an iso-propyl group, an n-butyl group, an iso-butyl group, a sec-butyl group, and a tert-butyl group, but are not limited thereto.

In one embodiment of the present disclosure, preferably,

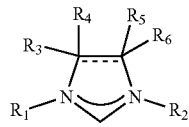

of Formula 1 may be one selected from the group consisting of ligands represented by the following Formulas 1a to 1j.

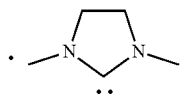
[Formula 1a]

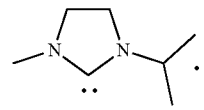
[Formula 1b]

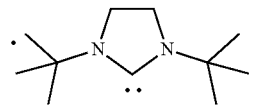
[Formula 1c]

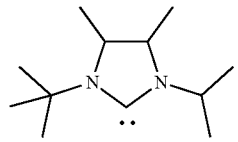
[Formula 1d]

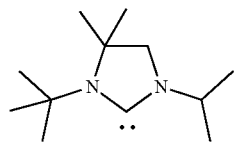
[Formula 1e]

[Formula 1f]

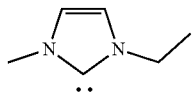
[Formula 1g]

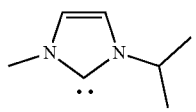
[Formula 1h]

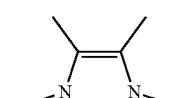
[Formula 1i]

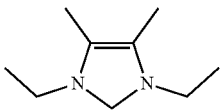
[Formula 1j]

In one embodiment of the present disclosure, preferably, the compound may be one compound selected from the group consisting of compounds represented by the following Formulas 1-1 to 1-7.

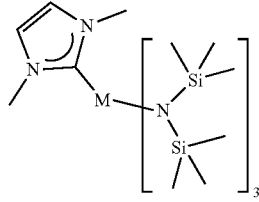
[Formula 1-1]

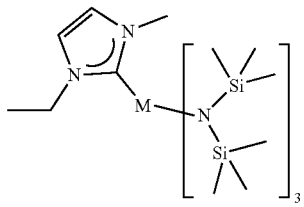
[Formula 1-2]

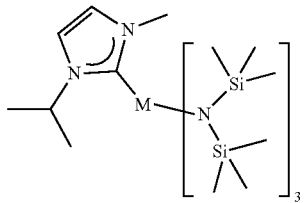
[Formula 1-3]

[Formula 1-4]

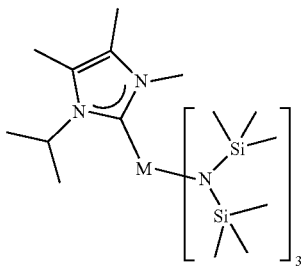

[Formula 1-5]

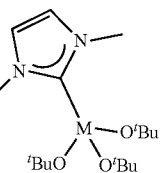

[Formula 1-6]

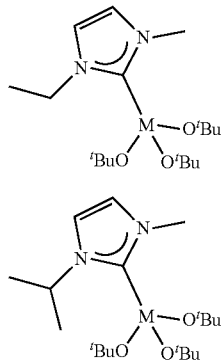

[Formula 1-7]

In Formulas 1-1 to 1-7,
M is a rare earth element, and
$^t$Bu is tert-butyl.

In one embodiment of the present disclosure, the rare earth element may be any one of scandium (Sc), yttrium (Y), lanthanum (La), cerium (CO, praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

A deposition precursor, preferably, a vapor deposition precursor according to another embodiment of the present disclosure contains the compound.

A method of manufacturing a thin film according to still another embodiment of the present disclosure includes introducing the vapor deposition precursor into a chamber. The introducing of the vapor deposition precursor into the chamber may include physical adsorption, chemical adsorption, or physical and chemical adsorption.

In one embodiment of the present disclosure, the method of manufacturing a thin film may include atomic layer deposition (ALD) or chemical vapor deposition (CVD). The CVD may include metal organic chemical vapor deposition (MOCVD), low pressure chemical vapor deposition (LPCVD), pulsed chemical vapor deposition (P-CVD), plasma enhanced atomic layer deposition (PE-ALD), or a combination thereof, but the present disclosure is not limited thereto.

In one embodiment of the present disclosure, the method of manufacturing a thin film may further include introducing one or more of hydrogen ($H_2$), a cot pound containing an oxygen (O) atom, and a compound containing a nitrogen (N) atom as a reactive gas.

In a case where a desired rare earth-containing film contains oxygen, the reactive gas may be selected from oxygen ($O_2$), ozone ($O_3$), water ($H_2O$), hydrogen peroxide ($H_2O_2$), and arbitrary combination thereof, but the present disclosure is not limited thereto.

In a case where a desired rare earth-containing film contains nitrogen, the reactive gas may be selected from nitrogen ($N_2$), ammonia ($NH_3$), hydrazine ($N_2H_4$), and arbitrary combination thereof, but the present disclosure is not limited thereto.

In addition, a desired rare earth-containing film may contain another metal.

Hereinafter, the present disclosure will be described in more detail with reference to Synthesis Examples, Examples, Experimental Examples, and Preparation Examples, but the present disclosure is not limited thereto.

<Synthesis Example 1>Synthesis of (NEC)La[N(SiMe$_3$)$_2$]$_3$ 7.36 g (0.03 mol) of lanthanum(III) chloride and 0.03 mol of alkyl imidazolium chloride or bromide (1-R1-3-R2-4-R3-5-R4-imidazolium chloride or bromide) were weighed in a flask, and 200 mL of tetrahydrofuran (THF) was added to dissolve the compounds. 22 g (0.12 mol) of sodium bis(trimethylsilyl)amide dissolved in THF was slowly added to the solution at 0° C. Thereafter, stirring was performed at room temperature for about 16 hours and the reaction was completed. Then, the solvent and volatile by-products were removed under vacuum. The residue was diluted by adding hexane, the diluted residue was filtered through a filter containing celite, and the filtrate was again dried under vacuum. The solid was again dissolved in hexane and recrystallized at −40° C. to obtain a colorless or white crystalline solid.

The reaction of Synthesis Example 1 is represented by the following Chemical Reaction Formula 1.

[Chemical Reaction Formula 1]

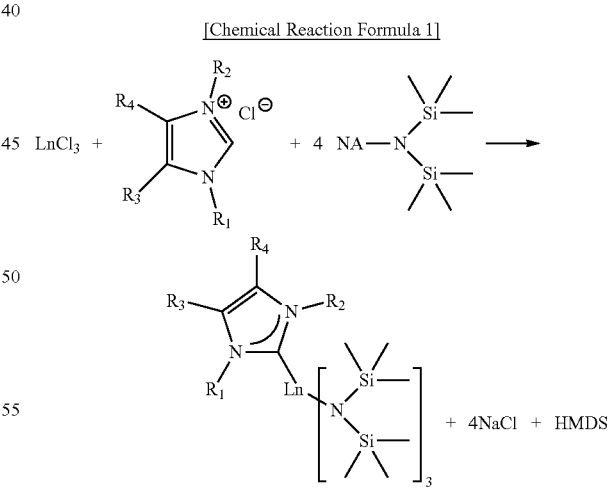

In Chemical Reaction Formula 1, HMDS is hexamethyldisilazane,

<Synthesis Example 2>Synthesis of (NHC)La(O$^t$Bu)$_3$ (NHC)La[N(SiMe$_3$)$_2$]$_3$ (0.0045 mol) synthesized in Synthesis Example 1 was dissolved in 50 of toluene, and 1.28 mL (0.0135 mol) of tertiary butyl alcohol diluted in toluene was slowly added at 0° C. Thereafter, stirring was performed at room temperature for about 16 hours and the reaction was completed. Then, the solvent and volatile by-products were removed under vacuum. The residue was diluted by adding hexane, the diluted residue was filtered through a filter containing celite, and the filtrate was again dried under vacuum. The solid was again dissolved in hexane and recrystallized at −40° C. to obtain an orange The reaction of Synthesis Example 2 is represented by the following Chemical Reaction Formula 2.

[Chemical Reaction Formula 2]

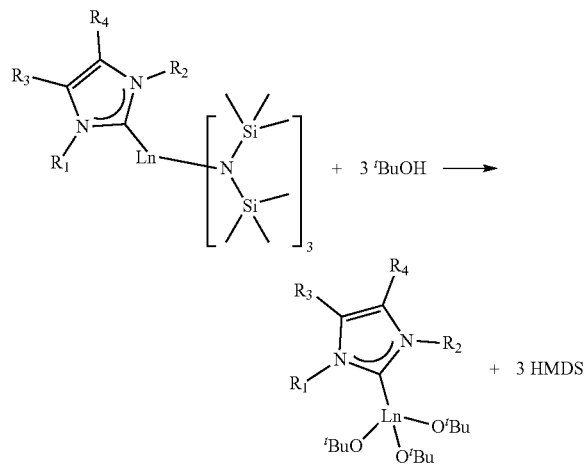

In Chemical Reaction Formula 2, $^tBu$ is tert-butyl and HMDS is hexamethyldisilazane.

<Example 1>Synthesis of (Me,Me-NHC)La[N(SiMe$_3$)$_2$]$_3$ (Me,Me-NHC)La[N(SiMe$_3$)$_2$]$_3$ was synthesized according to Synthesis Example 1. In Chemical Reaction Formula 1, each of $R_1$ and $R_2$ is methyl, each of $R_3$ and $R_4$ is hydrogen, Ln is lanthanum (La), and the synthesized compound is represented by the following Formula 3-1.

[Formula 3-1]

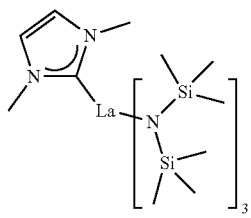

The synthesized compound was a colorless and crystalline solid, the yield was 70.51%, and the measured $^1$H-NMR peak was as follows.

$^1$H-NMR (400 MHz, C$_6$D$_6$): δ0.35 (s, 54H), δ3.36 (s, 6H), δ5.94 (s, 2H)

<Example 2>Synthesis of (Et,Me-NHC)La[N(SiMe$_3$)$_2$]$_3$ (Et,Me-NHC)La[N(SiMe$_3$)$_2$]$_3$ was synthesized according to Synthesis Example 1. In Chemical Reaction Formula 1, each of $R_1$ and $R_2$ is ethyl or methyl, each of $R_3$ and $R_4$ is hydrogen, Ln is lanthanum (La), and the synthesized compound is represented by the following Formula 3-2.

[Formula 3-2]

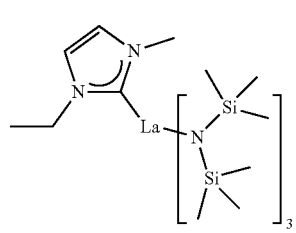

The synthesized compound was a colorless and crystalline solid, the yield was 60.26%, and the measured $^1$H-NMR peak was as follows.

$^1$H-NMR (400 MHz, C$_6$D$_6$): δ0.36 (s, 54H), δ1.10 (t, 3H), δ3.40 (s, 3H), δ3.86 (q, 2H), δ6.00 (s, 1H), δ6.10 (s, 1H)

<Example 3>Synthesis of (Et,Me-NEC)Y[N(SiMe$_3$)$_2$]$_3$ (Et,Me-NHC)Y[N(SiMe$_3$)$_2$]$_3$ was synthesized according to Synthesis Example 1. In Chemical Reaction Formula 1, each of $R_1$ and $R_2$ is ethyl or methyl, each of $R_3$ and $R_4$ is hydrogen, Ln is yttrium (Y), and the synthesized compound is represented by the following Formula 3-3.

[Formula 3-3]

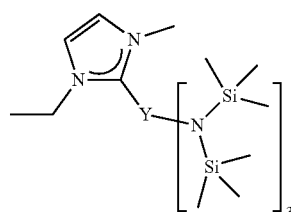

The synthesized compound was a colorless and crystalline solid, the yield was 57.5%, and the measured $^1$H-NMR peak was as follows.

$^1$H-NMR (400 MHz, C$_6$D$_6$): δ0.39 (s, 54H), δ0.94 (t, 3H), δ3.52 (s, 3H), δ3.85 (q, 2H), δ5.86 (s, 1H), δ5.98 (s, 1H)

<Example 4>Synthesis of ($^i$Pr, Me-NHC)La[N(SiMe$_3$)$_2$]$_3$ ($^i$Pr,Me-NHC)La[N(SiMe$_3$)$_2$]$_3$ was synthesized according to Synthesis Example 1. In Chemical Reaction Formula 1 each of $R_1$ and $R_2$ is iso-propyl or methyl, each of $R_3$ and $R_4$ is hydrogen, Ln is lanthanum (La), and the synthesized compound is represented by the following Formula 3-4.

[Formula 3-4]

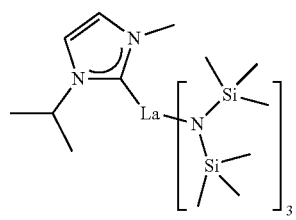

The synthesized compound was a white and crystalline solid, the yield was 52.44%, and the measured $^1$H-NMR peak was as follows.

$^1$H-NMR (400 MHz, C$_6$D$_6$): δ0.35 (s, 54H), δ1.18 (d, 6H), δ3.41 (s, 3H), δ4.71 (m, 1H), δ6.03 (s, 1H), δ6.24 (s, 1H)

<Example 5>Synthesis of ($^i$Pr,Me,Me,Me-NHC)La[N(SiMe$_3$)$_2$]$_3$ ($^i$Pr,Me,Me,Me-NHC)La[N(SiMe$_3$)$_2$]$_3$ was synthesized according to Synthesis Example 1. In Chemical Reaction Formula 1, each of R$_1$ and R$_2$ is iso-propyl or methyl, each of R$_3$ and R$_4$ is methyl, Ln is lanthanum (La), and the synthesized compound is represented by the following Formula 3-5.

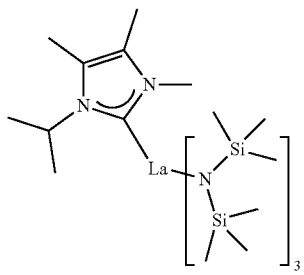

[Formula 3-5]

The synthesized compound was an ivory and crystalline solid, the yield was 77%. and the measured $^1$H-NMR peak was as follows.

$^1$H-NMR (400 MHz, C$_6$D$_6$): δ0.30 (s, 54H), δ1.34 (d, 6H), δ1.37 (s, 3H), δ1,58 (s, 3H), δ3.38 (s, 3H), δ4.30 (s, 1H)

<Example 6>Synthesis of (Me,Me-NHC)La(O$^t$Bu)$_3$ (Me,Me-NHC)La(O$^t$Bu)$_3$ was synthesized according to Synthesis Example 2. In Chemical Reaction Formula 2, each of R$_1$ and R$_2$ is methyl, each of R$_3$ and R$_4$ is hydrogen, Ln is lanthanum (La), and the synthesized compound is represented by the following Formula 4-1.

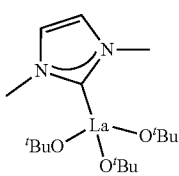

[Formula 4-1]

in Formula 4-1, $^t$Bu is tent-butyl.

The synthesized compound was an orange and crystalline solid, the yield was 31.77%, and the measured $^1$H-NMR peak was as follows.

$^1$H-NMR (400 MHz, C$_6$D$_6$): δ1.41 (s, 27H), δ3.37 (s, 6H), δ6.22 (s, 2H)

<Example 7>Synthesis of (Et,Me-NHC)La(O$^t$Bu)$_3$ (Et,Me-NHC)La(O$^t$Bu)$_3$ was synthesized according to Synthesis Example 2. In Chemical Reaction Formula 2, each of R$_1$ and R$_2$ is ethyl or methyl, each of R$_3$ and R$_4$ is hydrogen, Ln is lanthanum (La), and the synthesized compound is represented by the following Formula 4-2.

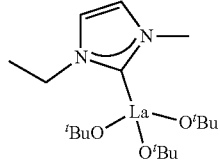

[Formula 4-2]

In Formula 4-2, $^t$Bu is tert-butyl.

The synthesized compound was an orange and crystalline solid, the yield was 30,46%, and the measured $^1$H-NMR peak was as follows.

$^1$H-NMR (400 MHz, C$_6$D$_6$): δ1.14 (t, 3H), δ1.45 (s, 27H), δ3.39 (s, 3H), δ3.81 (q, 2H), δ6.26 (s, 1H), δ6.33 (s, H)

<Example 8>Synthesis of (Et,Me-NHC)Y(O$^t$Bu)$_3$ (Et,Me-NHC)Y(O$^t$Bu)$_3$ was synthesized according to Synthesis Example 2. In Chemical Reaction Formula 2, each of R$_1$ and R$_2$ is ethyl or methyl, each of R$_3$ and R$_4$ is hydrogen, Ln is yttrium (Y), and the synthesized compound is represented by the following Formula 4-3.

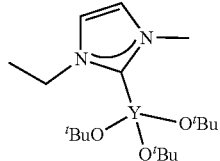

[Formula 4-3]

In Formula 4-3, $^t$Bu is tert-butyl.

The synthesized compound was an orange and crystalline solid, the yield was 95.7%, and the measured $^1$H-NMR peak was as follows.

$^1$H-NMR (400 MHz, C$_6$D$_6$): δ1.18 (t, 3H), δ1.48 (s, 27H), δ3.64 (s, 3H), δ4.16 (q, 2H), δ6.13 (s, 1H), δ6.22 (s, 1H)

<Example 9>Synthesis of ($^i$Pr, Me-NHC)La(O$^t$Bu)$_3$ ($^i$Pr,Me-NHC)La(O$^t$Bu)$_3$ was synthesized according to Synthesis Example 2. In Chemical Reaction Formula 2, each of R$_1$ and R$_2$ is iso-propyl or methyl, each of R$_3$ and R$_4$ is hydrogen, Ln is lanthanum (La), and the synthesized compound is represented by the following Formula 4-4.

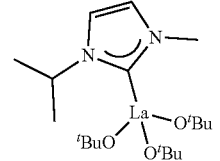

[Formula 4-4]

In Formula 4-4, $^t$Bu is tert-butyl.

The synthesized compound was an orange and crystalline solid, the yield was 89.35%, and the measured $^1$H-NMR peak was as follows.

$^1$H-NMR (400 MHz, C$_6$D$_6$): δ1.25 (d, 6H), δ1.41 (s, 27H), δ3.44 (s, 3H), δ4.48 (m, 1H), δ6.28 (s, 1H), δ6.41 (s, 1H)

Experimental Example 11 Differential Scanning Calorimetry (DSC)

Differential scanning calorimetry (DSC) was performed to measure thermal properties of Examples 1-1, 1-2, and 1-4. The results are shown in FIG. 1.

The DSC 214 Polyma (manufactured by NETZSCH) was used as the apparatus, each of the samples was weighed to about 10 mg, the sample was placed in a closed high pressure gold plated Al pan, and the sample was measured at a temperature from 50° C. to 350° C. at a temperature increase rate of 10° C.

As a result of the measurement, the melting points of the compounds of Examples 1-1, 1-2, and 1-4 were 153° C., 138° C., and 119° C., respectively.

In addition, the decomposition temperatures of the compounds of Examples 1-1, 1-2, and 1-4 were 257° C., 254° C., and 257° C., respectively.

It could be confirmed that all the decomposition temperatures of the compounds of Examples 1-1, 1-2, and 1-4 were 250° C. or higher, which showed that the thermal stability of each of the synthesized compounds was excellent.

Experimental Example 21 Thermogravimetric Analysis (TGA)

Thermogravimetric analysis (TGA) of each of the synthesized compounds was performed. A 50 μL alumina crucible (TGA/DSC 1 STAR System, manufactured by Mettler Toledo) was used as an apparatus for the thermogravimetric analysis. In the thermogravimetric analysis, a method of heating the compounds to 400° C. at a rate of 10° C./min was used, and argon (Ar) gas was injected at a rate of 200 mL/min.

Figure 2:
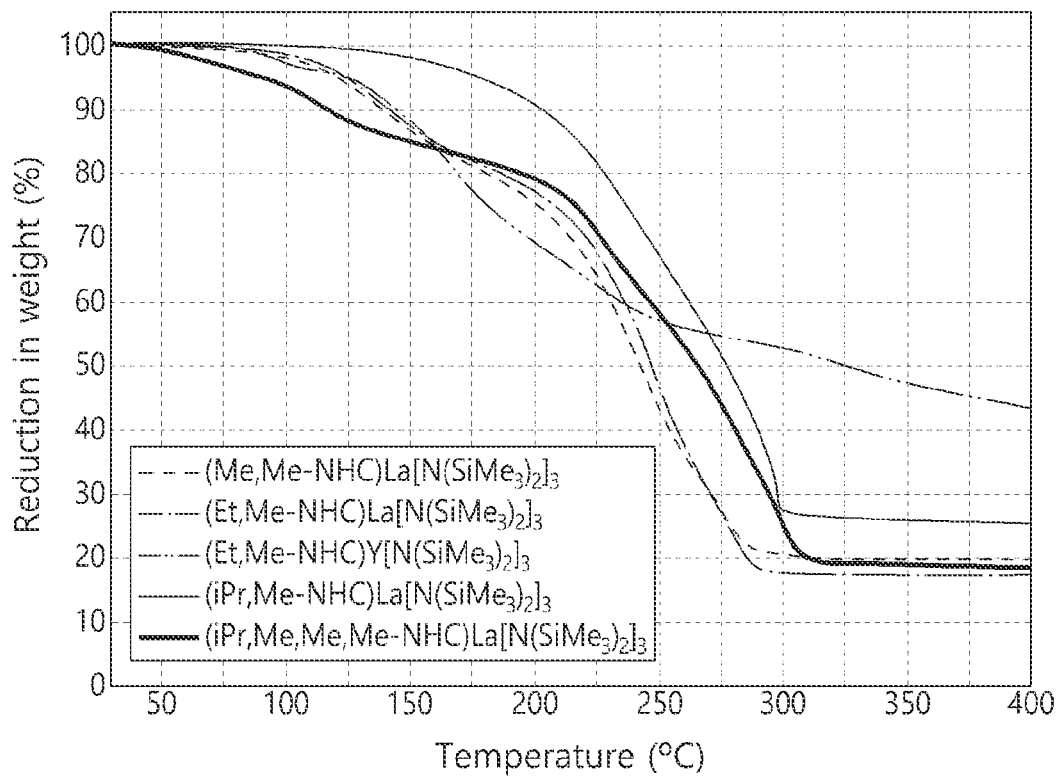
FIG. 2 is a graph showing results of thermogravimetric (TG) analysis of compounds of Examples 1 to 5 of the present disclosure (Example 1: (Me,Me-NHC)La[N(SiMe$_3$)$_2$]$_3$, Example 2: (Et,Me-NHC)La[N(SiMe$_3$)$_2$]$_3$, Example 3: (Et,Me-NHC)Y[N(SiMe$_3$)$_2$]$_3$, Example 4: ($^i$Pr,Me-NHC)La[N(SiMe$_3$)$_2$]$_3$, Example 5: ($^i$Pr,Me,Me,Me-NHC)La[N(SiMe$_3$)$_2$]$_3$).
Figure 3:
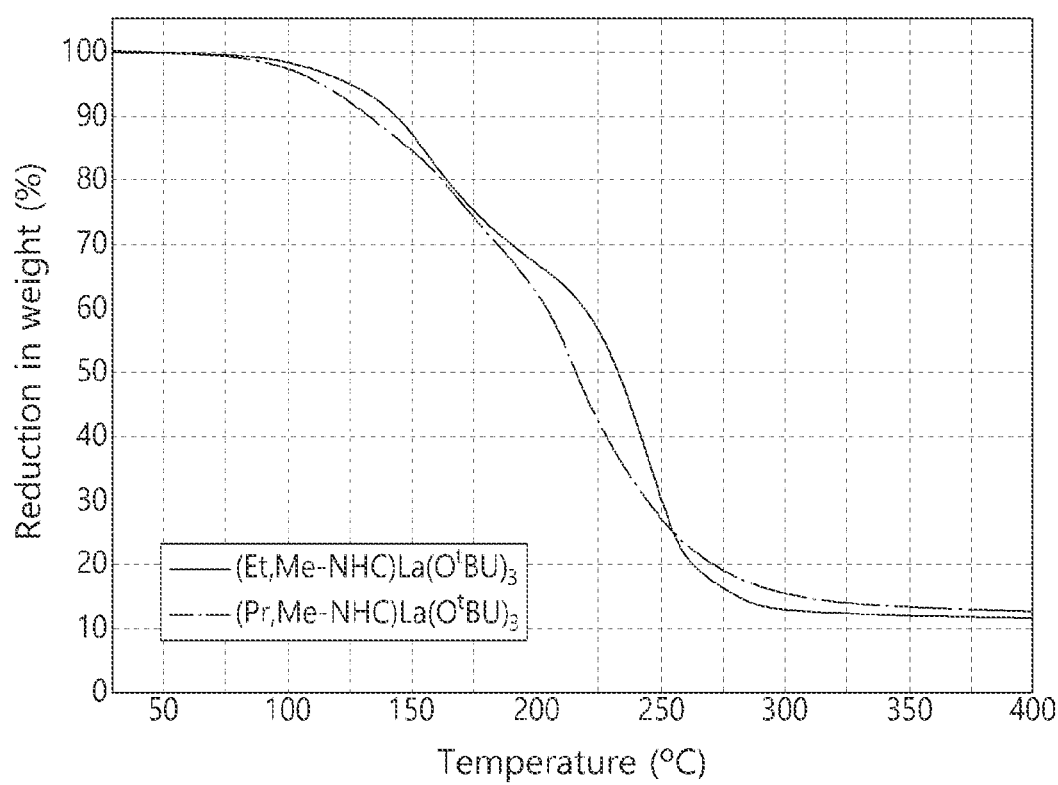
FIG. 3 is a graph showing results of thermogravimetric (TG) analysis of compounds of Examples 7 and 9 of the present disclosure (Example 7: (Et,Me-NHC)La(O$^t$Bu)$_3$, Example 9: ($^i$Pr,Me-NHC)La(O$^t$Bu)$_3$).

The results of the thermogravimetric analysis of the compounds of Examples 1-1 to 1-5 are shown in FIG. 2, and the results of the thermogravimetric analysis of the compounds of Examples 1-7 and 1-9 are shown in FIG. 3.

According to the results of the thermogravimetric analysis, the temperature at which the weight of the compound was reduced by half [T½] was measured to be 243° C. for the compound of Example 1-1, 247° C. for the compound of Example 1-2, 324° C. for the compound of Example 1-3, 278° C. for the compound of Example 1-4, 266° C. for the compound of Example 1-5, 233° C. for the compound of Example 1-7, and 216° C. for the compound of Example 1-9.

In addition, the amount of residue at 400° C. was measured to be 19.47% for the compound of Example 1-1, 17.29% for the compound of Example 1-2, 43.79% for the compound of Example 1-3, 25,17% for the compound of Example 1-4, 18,46% for the compound of Example 1-5, 11.65% for the compound of Example 1-7, and 12.64% for the compound of Example 1-9.

Accordingly, the weight of each of the compounds synthesized by Chemical Reaction Formula 1 was reduced by half at about 240° C. or higher, and the weight of each of the compounds synthesized by Chemical Reaction Formula 2 was reduced by half at about 210° C. or higher, which showed that T$_{1/2}$ of each of the compounds synthesized by Chemical Reaction Formula 1 was relatively higher than T$_{1/2}$ of each of the compounds synthesized by Chemical Reaction Formula 2. In addition, it could be confirmed that the thermal stability of each of the compounds synthesized by Chemical Reaction Formulas 1 and 2 was excellent.

Preparation Example 1

A rare earth thin film was deposited on a substrate by alternatively applying the novel rare earth precursors synthesized by Examples 1-1 to 1-6 of the present disclosure and a reactant O$_3$. The substrate used in the present experiment was a p-type Si wafer and a resistance was 0.02 Ωm. Prior to the deposition, the p-type Si wafer was cleaned by ultrasonic treatment (Ultra sonic) in acetone, ethanol, and deionized water (DI water) for 10 minutes for each, The native oxide thin film formed on the Si wafer was removed after being immersed in a solution of 10% HF (HF:H$_2$O=1: 9) for 10 seconds.

The substrate was prepared while the temperature thereof was maintained at 150 to 450° C., and the novel solid rare earth precursor synthesized by Example 1 was vaporized in a bubbler in which a temperature was maintained at 90 to 150° C.

Argon (Ar) was fed as purge gas to purge the precursor and the reactive gas remaining in the deposition chamber, and the flow rate of argon was 1,000 sccm. Ozone (O$_3$) having a concentration of 224 g/cm$^3$ was used as the reactive gas, each reactive gas was injected by controlling on/off of a pneumatic valve, and a film was formed at a processing temperature.

The following procedure was included in the ALD cycle: a precursor pulse for 10/15 seconds, purge with argon for 10 seconds, a reactant pulse for 2/5/8/10 seconds, and then purge with argon for 10 seconds. The pressure of the deposition chamber was adjusted to 1 to 1.5 torr, and the deposition temperature was adjusted to 150 to 450° C.

It could be confirmed that lanthanum oxide and yttrium oxide thin films were formed using the compounds of Examples 1-1 to 1-6 as precursors.

Preparation Example 2

A lanthanum oxide thin film was deposited on a substrate under the same conditions as those of Preparation Example 1, except that the novel rare earth precursors synthesized by Examples 1-7 to 1-9 of the present disclosure were used.

It could be confirmed that lanthanum oxide and yttrium oxide thin films were formed using the compounds of Examples 1-7 to 1-9 as precursors.

Preparation Example 3

A thin film containing a rare earth element was manufactured by chemical vapor deposition using the novel rare earth precursors synthesized by Examples 1-1 to 1-9 of the present disclosure. A starting precursor solution containing the precursors synthesized by Examples 1-1 and 1-9 was prepared.

The starting precursor solution was transferred to a vaporizer in which a. temperature was maintained at 90 to 150° C. at a flow rate of 0.1 cc/ruin. The vaporized precursor was transferred to a deposition chamber using 50 to 300 sccm helium carrier gas. Each of hydrogen (H$_2$) and oxygen (O$_2$) was used as a reactive gas and was fed to the deposition chamber at a flow rate of 0.5 L/min (0.5 pm). The pressure of the deposition chamber was adjusted to 1 to 15 torr, and the deposition temperature was adjusted to 150 to 4,50° C. The deposition process was performed under such conditions for about 15 minutes.

It could be confirmed that lanthanum oxide and yttrium oxide thin films were formed using the compounds of Examples 1-1 to 1-9 as precursors.

The rare earth-containing precursor and one or more types of reactive gas may be introduced into a reaction chamber at the same time by chemical vapor deposition, atomic layer deposition, or another combination, As an example, the rare earth-containing precursor may be introduced in one pulse, and two additional metal sources may be introduced together in a separate pulse. In addition, the reaction chamber may already contain the reactant prior to introduction of the rare earth-containing precursor.

The reactive gas may be passed through a plasma system located far from the reaction chamber and decomposed to radicals. In addition, the rare earth-containing precursor may be continuously introduced into the reaction chamber while other metal sources were introduced by pulse.

For example, in the atomic layer deposition process, the vapor phase of the rare earth-containing precursor may be introduced into the reaction chamber to be in contact with a suitable substrate, and then, the excessive amount of the rare earth-containing precursor may be removed from the reaction chamber by purging the reactor.

An oxygen source is introduced into the reaction chamber, and the oxygen source reacts with the absorbed rare earth precursor in the reaction chamber in a self-limiting manner. The excessive amount of the oxygen source is removed from the reaction chamber by purging and/or evacuating the reaction chamber. In a case where a desired film is a rare earth oxide film, the process may be repeated until a film having a desired thickness is obtained.

It was confirmed through the thin film manufacturing described above that the problems in the thin film deposition of the existing rare earth precursor were solved by the novel rare earth precursors synthesized by Examples 1-1 to 1-9, volatility and thermal stability applicable to not only CND but also ALD were excellent, and reactivity with the reactive gas was also excellent.

In addition, uniform thin film deposition is implemented using the novel rare earth precursor, and thus, excellent thin film physical properties, thickness, and step coverage may be secured.

It is to be understood that the scope of the present disclosure will be defined by the claims rather than the above-mentioned description and all modifications and alternations derived from the claims and their equivalents are included in the scope of the present disclosure.

What is claimed is:

1. A compound represented by the following Formula 1,

[Formula 1]

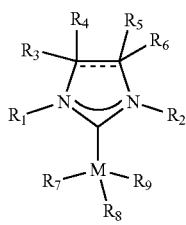

in Formula 1,

M is a rare earth element, $R_1$ to $R_6$ are each independently hydrogen or a linear or branched alkyl group having 1 to 6 carbon atoms, $R_7$ to $R_9$ are each independently a linear or branched alkyl group having 1 to 5 carbon atoms, $-OR_{10}$, or $-N(R_{11})_2$, $R_{10}$'s are each independently hydrogen or a linear or branched alkyl group having 1 to 6 carbon atoms, $R_{11}$'s are each independently hydrogen, a linear or branched alkyl group having 1 to 6 carbon atoms, or $Si(R_{12})_3$, and $R_{12}$'s are each independently hydrogen or a linear or branched alkyl group having 1 to 6 carbon atoms.

2. The compound of claim 1, wherein $R_1$ to $R_6$ and $R_{10}$ to $R_{12}$ are each independently one selected from the group consisting of hydrogen, a methyl group, an ethyl group, an n-propyl group, an iso-propyl group, an n-butyl group, an iso-butyl group, a sec-butyl group, and a tert-butyl group.

3. The compound of claim 1, wherein

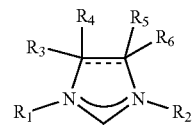

of Formula 1 is one selected from the group consisting of ligands represented by the following Formulas 1a to 1j,

[Formula 1a]

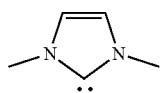

[Formula 1b]

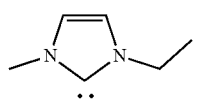

[Formula 1c]

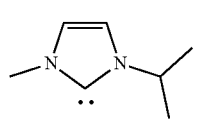

[Formula 1d]

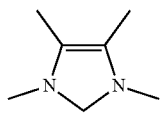

[Formula 1e]

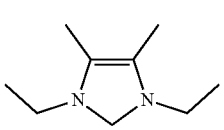

[Formula 1f]

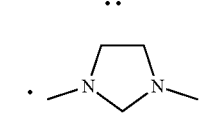

[Formula 1g]

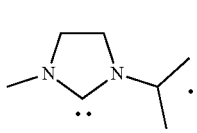

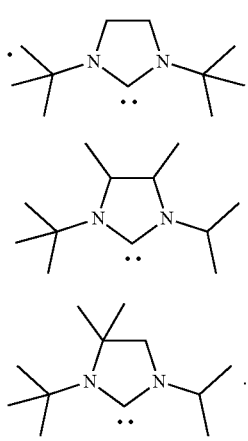

4. The compound of claim 1, wherein the compound is one selected from the group consisting of compounds represented by the following Formulas 1-1 to 1-7,

[Formula 1-1]
[Formula 1-2]
[Formula 1-3]
[Formula 1-4]

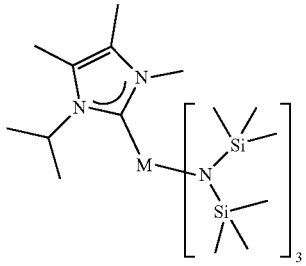

[Formula 1-5]

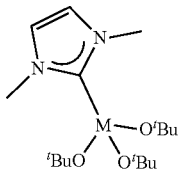

[Formula 1-6]

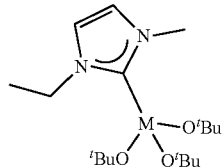

[Formula 1-7]

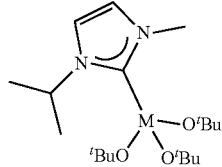

in Formulas 1-1 to 1-7,

M is a rare earth element, and $^{t}$Bu is tert-butyl.

5. The compound of claim 1, wherein the rare earth element is scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

6. A vapor deposition precursor comprising the compound of claim 1.

* * * * *